United States Patent [19]
Dockerty et al.

[11] Patent Number: 5,796,169
[45] Date of Patent: Aug. 18, 1998

[54] STRUCTURALLY REINFORCED BALL GRID ARRAY SEMICONDUCTOR PACKAGE AND SYSTEMS

[75] Inventors: Robert Charles Dockerty, Austin; Ronald Maurice Fraga, Pflugerville; Ciro Neal Ramirez, Round Rock, all of Tex.; Sudipta Kumar Ray, Wappingers Falls; Charles Levern Reynolds, Jr., Red Hood, both of N.Y.; Gordon Jay Robbins, Austin, Tex.

[73] Assignee: International Business Machines Corporation, Armonk, N.Y.

[21] Appl. No.: 752,418

[22] Filed: Nov. 19, 1996

[51] Int. Cl.$^6$ .......................... H01L 23/48; H01L 23/52; H01L 29/40
[52] U.S. Cl. .......................... 257/780; 257/738; 257/778; 257/779
[58] Field of Search .......................... 257/738, 778–80

[56] References Cited

U.S. PATENT DOCUMENTS

| | | | |
|---|---|---|---|
| 2,842,831 | 7/1958 | Pfann | 257/738 |
| 3,932,934 | 1/1976 | Lynch et al. | 29/628 |
| 4,413,308 | 11/1983 | Brown | 361/749 |
| 4,503,597 | 3/1985 | Kushima et al. | 29/569 R |
| 4,509,096 | 4/1985 | Baldwin et al. | 361/719 |
| 4,604,644 | 8/1986 | Beckham et al. | 361/783 |
| 4,664,309 | 5/1987 | Allen et al. | 228/180.2 |
| 4,705,205 | 11/1987 | Allen et al. | 228/180.2 |
| 4,878,611 | 11/1989 | LoVasco et al. | 228/180.2 |
| 4,927,697 | 5/1990 | IHill | 428/198 |
| 5,001,829 | 3/1991 | Schelhorn | 29/840 |
| 5,088,007 | 2/1992 | Misssele | 361/771 |
| 5,222,014 | 6/1993 | Lin | 361/729 |
| 5,233,504 | 8/1993 | Melton et al. | 361/760 |
| 5,251,806 | 10/1993 | Agarwala et al. | 228/180.22 |
| 5,324,892 | 6/1994 | Granier et al. | 174/250 |
| 5,349,495 | 9/1994 | Visel et al. | 361/774 |
| 5,381,307 | 1/1995 | Hertz et al. | 361/767 |
| 5,397,921 | 3/1995 | Karnezos | 257/779 |
| 5,400,950 | 3/1995 | Myers et al. | 228/180.22 |
| 5,468,655 | 11/1995 | Greer | 437/8 |
| 5,490,040 | 2/1996 | Gaudenzi et al. | 361/773 |
| 5,498,903 | 3/1996 | Dixon et al. | 257/690 |
| 5,541,450 | 7/1996 | Jones et al. | 257/697 |
| 5,633,535 | 5/1997 | Chao et al. | 257/778 |

OTHER PUBLICATIONS

IBM Technical Disclosure Bulletin, vol. 32, No. 8A, Jan. 1990, "Latchless Pneumatic Impact Actuator", pp. 483–486.

IBM Technial Disclosure Bulletin, vol. 38, No. 02, Feb. 1995, "Surface Mount Heat Sink for Solder Ball Connect Modules and C4 Chip to Card Attach", p. 419.

*Primary Examiner*—Teresa M. Arroyo
*Attorney, Agent, or Firm*—Casimer K. Salys

[57] ABSTRACT

Supporting structure for a ball grid array surface mounted integrated circuit device composed of support solder formed at selective corner locations on the ball grid array surface of the integrated circuit device. In one form, L-shaped patterns of high melting temperature solder are formed along the axes defined by the ball grid array and are characterized in that cross sections of the L-shaped pattern match that of the solder balls along one axis, and represent a continuum of solder between solder ball locations along the other axis. Support solder can be added where necessary to provide both structural reinforcement and thermal conduction. Control of the cross section of the support solder ensures that surface tension effects of the molten low temperature reflow solder used to connect the integrated circuit device does not materially change the final relative spacing between the integrated circuit device balls and the underlying printed circuit board contacts.

23 Claims, 3 Drawing Sheets

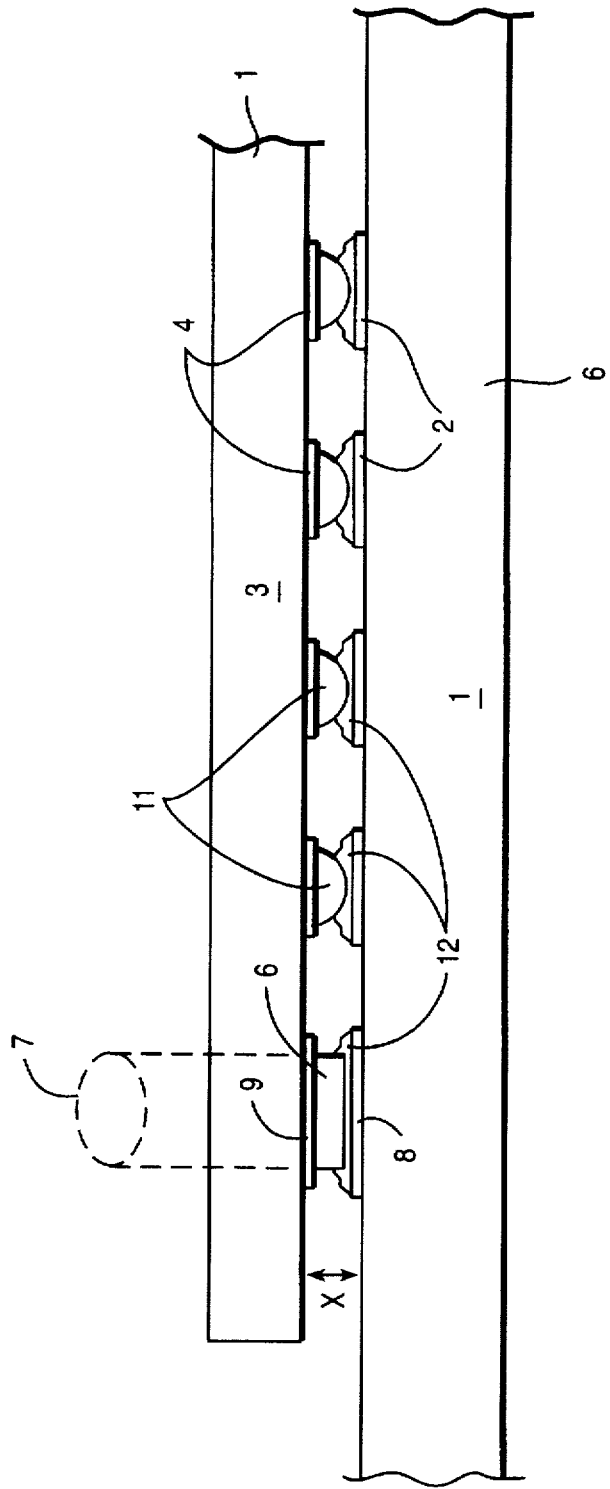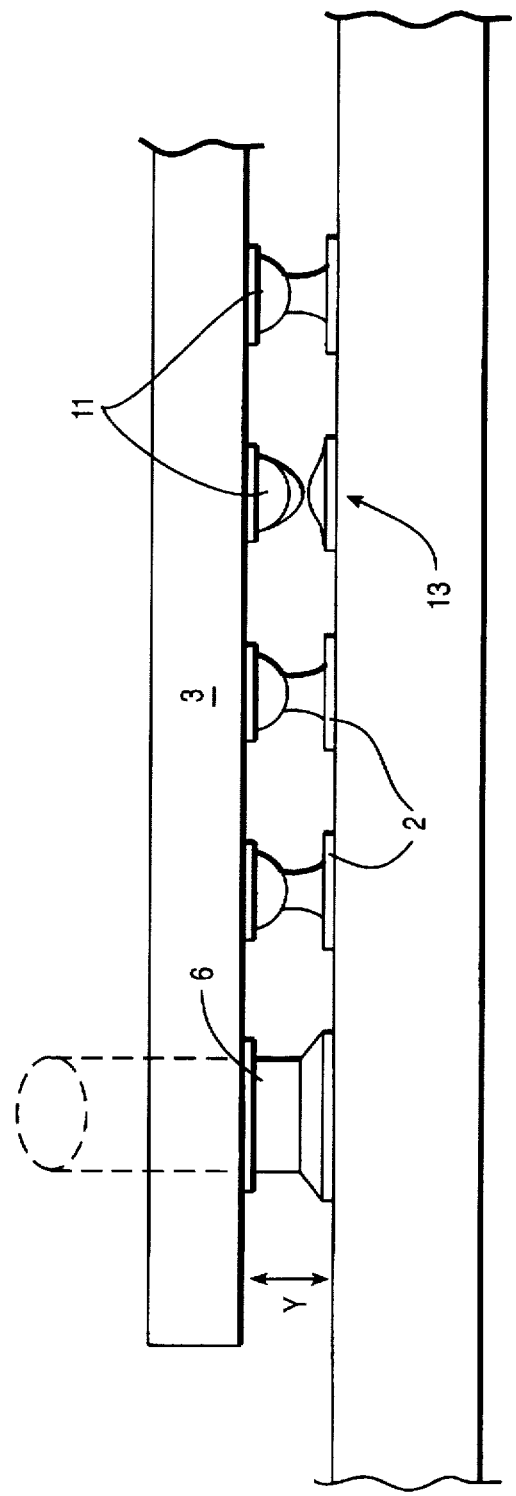

STRUCTURALLY REINFORCED BALL GRID ARRAY SEMICONDUCTOR PACKAGE AND SYSTEMS

CROSS-REFERENCE TO RELATED APPLICATIONS

The present application is related to copending U.S. patent application Ser. No. 08/688,073, filed on Jul. 29, 1996, and assigned to the assignee of the present application.

FIELD OF THE INVENTION

The present invention relates generally to surface mounted integrated circuit devices. More particularly, the invention is directed to structural configurations suitable to reinforce ball grid array connected integrated circuit devices which are subject to forces introduced by a mated heat sink or like mass.

BACKGROUND OF THE INVENTION

Integrated circuit devices and their applications have undergone tremendous change in evolving to what is presently considered a contemporary design. Integrated circuit die (chip) sizes have increased dramatically, as have their operational clock rates. At the same time both the active and passive integrated circuit elements dimensions have decreased. As a consequence of such trends, advanced integrated circuit devices require materially greater pinout counts and higher power dissipation capabilities.

Numerous desirable integrated circuit device packaging and connection objectives can be satisfied with ball grid array technology, including both the flip-chip and ceramic package variants. Low power dissipation can be managed through the use of miniature heat sinks which attach directly to the flip-chip or ceramic packages. However, with the power output of advanced microprocessors and application specific integrated circuits (ASICs) approaching 100 watts, the early solutions to the power dissipation problem are no longer satisfactory.

The high power dissipation levels require large heat sinks and very low levels of thermal impedance between the heat sink and integrated circuit device. Therefore, the trend is toward heat sinks of significant mass and increasing compressive forces being applied between the body of the heat sink and the integrated circuit device. The effects of such pressure and mass, as further accentuated by shock and vibration, causes creep in the reflow solder connections and attendant increases in the failure rates of the electrical connections between the solder balls and the contacts on the underlying structure, typically being printed circuit boards.

The use of large cross-sectional area solder columns, analogous to those described in copending U.S. patent application Ser. No. 08/688,073, to reinforce the corners of the ball grid array type integrated circuit devices is not viable because columns and balls are fabricated by different manufacturing processes. As a result, they have different tolerances associated with their nominal heights. When solder balls, and reinforcing solder columns are joined to the integrated circuit devices, the balls and columns would not be coplanar within a tolerance required for subsequent attachment to an organic circuit board or other types of device carrying packages. In addition, integrated circuit devices utilizing ball grid array packages are typically joined to organic boards using low temperature 37/63 lead/tin solder. Since the supporting columns and balls have substantially different cross-sectional areas, the surface tension of the molten eutectic solder on mating pads on the organic board would tend to raise the columns more than the solder balls. This differential wetting of columns and balls may result in separation of some of the ball grid array connections from the mating pads on the board, resulting in a defective component on the organic board.

Therefore, there exists a need for a ball grid array device connection design which reinforces the solder ball structure in anticipation of heat sink attachment and compression without degrading the connection characteristics of the individual solder balls in the array.

SUMMARY OF THE INVENTION

The problems of the prior art are addressed by a surface mount substrate suitable to connect an integrated circuit on the substrate to a pattern of contacts on a surface of a dielectric planar through a structure comprised of a matrix array of solder balls formed onto a first side of the substrate, and at least one pattern of support solder formed onto the first side of the substrate and characterized in that the support solder profile in a direction coincident with a first axis of the matrix array substantially matches a cross section of a formed solder ball, and the support solder profile in a direction coincident with a second axis of the matrix array provides a cross section showing a continuum of solder extending from one solder ball to a succeedingly located solder ball.

In another form, the invention relates to a reinforced ball grid array device mounted to a printed circuit board and supporting a heat sink, comprising a pattern of contacts on a printed circuit board, a substrate with an integrated circuit, the substrate comprising a matrix array of solder balls formed onto a first side of a substrate, and at least one pattern of support solder formed onto the first side of the substrate characterized in that the support solder profile in a direction coincident with a first axis of the matrix array substantially matches a cross section of a formed solder ball, and in that the support solder profile in a direction coincident with a second axis of the matrix array provides a cross section showing a continuum of solder extending from one solder ball to the a succeedingly located solder ball, solder bond connections between the pattern of contacts on the printed circuit board and corresponding solder balls and support solder on the substrate, and heat sink in thermal contact with a planar surface on a second side of the substrate.

In a particularized form of the invention, L-shaped patterns of high melting temperature support solder, with a cross section analogous to the solder balls, are formed in corners of the substrate. Other shapes and other locations of support solder can be formed consistent with the premise that the cross section along one axis is analogous to that of a solder ball. The locations and shapes of the support solder structurally reinforce the connection while providing a thermal path between the substrate and the printed circuit board.

The key structural feature is to have the cross section of the support solder along one axis of the array match the cross section of the solder balls. Matching of the cross sections eliminates increased relative spacing between the substrate and the printed circuit board as a consequence of differences in the effects of molten reflow solder.

These and other features of the invention will be more clearly understood and appreciated upon considering the detailed embodiments described hereinafter.

BRIEF DESCRIPTION OF THE DRAWINGS

FIGS. 1 and 2 schematically depict stages in fabrication if large cross sectional area columns are used to reinforce a ball grid array integrated circuit device.

DESCRIPTION OF THE PREFERRED EMBODIMENT

Figure 3:
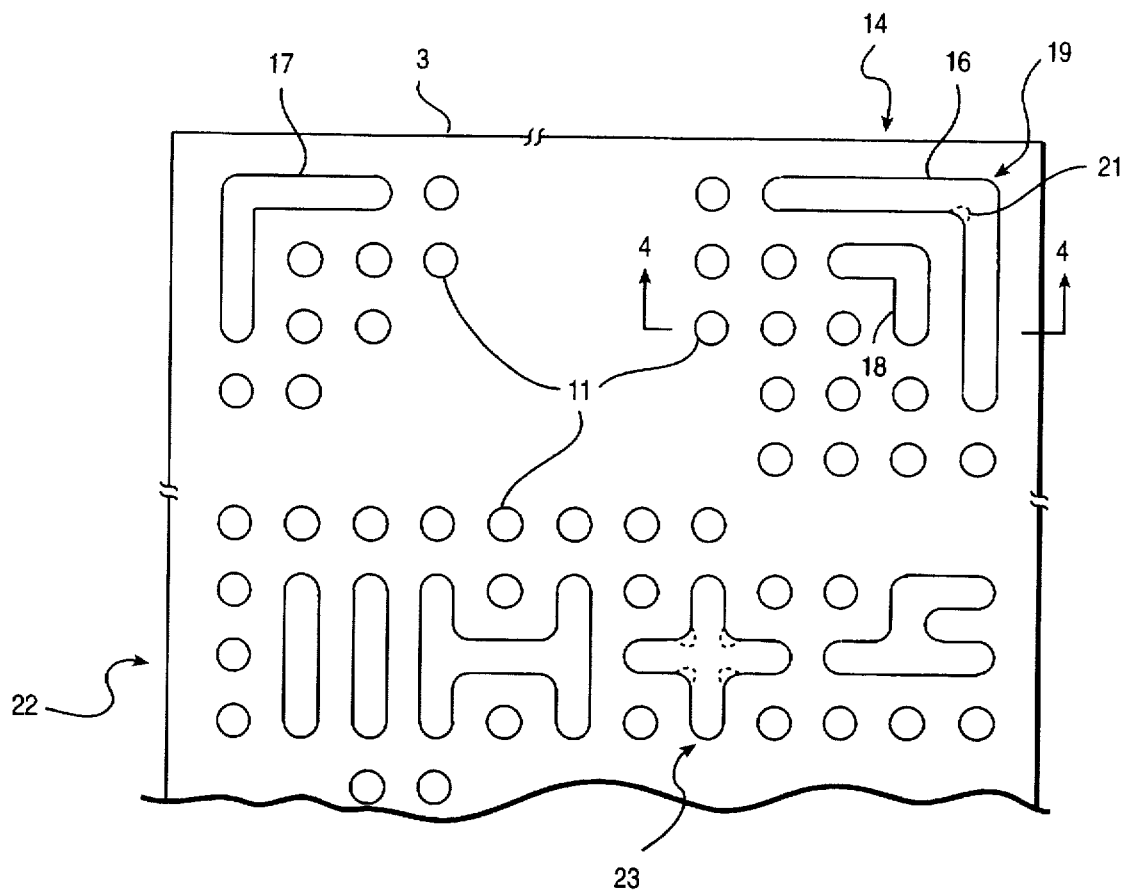
FIG. 3 schematically illustrates various embodiments of the support solder invention, including L-shaped pedestals of support solder in the corners and other support solder shapes as may be applicable to provide structural reinforcement and thermal conductivity.

The aforementioned need for ball grid array devices to maintain electrical connections through reflowed solder bonds at all the solder ball locations in the face of thermal cycling effects, compressive forces, and heat sink accentuated shock and vibration stresses, is now described in the context of connecting an integrated circuit device to a corresponding array of copper contacts on a printed circuit board. The integrated circuit device is a ceramic or plastic integrated circuit package with a ball grid array of input/output terminals, or a flip-chip integrated circuit die having a ball grid array of input/output terminals. The solder balls attached to the package or flip-chip die are preferably composed of a 90/10 lead/tin alloy solder, having a nominal melting temperature of 310° C. and routinely referred to as a high melting temperature solder.

The connections between the printed circuit board copper contacts and the solder balls are actually accomplished through the reflow of low melting temperature solder, deposited in paste form, the solder itself preferably being composed of 37/63 lead/tin alloy with a melting temperature of approximately 180° C.

The objective is to attach the integrated circuit device to the printed circuit board in such a way that solder ball connections are reliable in the presence of thermal and mechanical stresses as may be magnified by the presence of a heat sink in compression contact with the opposite side of the integrated circuit device. In today's technology it is not unusual to have a ball grid array integrated circuit device with 600 solder balls in the array, each of which must remain connected over an extended product life in the face of the earlier noted stresses.

FIGS. 1 and 2 schematically illustrate stages in approach suggested by the aforementioned copending patent application, but found unsuitable. FIG. 1 shows a side view of printed circuit board 1 having a pattern of copper contacts 2, an integrated circuit device 3, a multiplicity of device pads 4, and, at the corners of device 3, a large cross sectioned area cylindrical solder column 6, as further shown by projection 7. The wide solder connections between contact 8, on printed circuit board 1, and pads 9, on the integrated circuit device 3, provide the structural reinforcement. Solders balls 11 and support solder 6 are composed of 90/10 lead/tin high melting temperature solder and are bonded by reflow to pads 9 on device 3. Solder paste 12 is screen deposited onto contacts 2 and 8 before integrated circuit device 3 is positioned, paste 12 being composed of resin and low melting temperature 37/63 lead/tin type solder. Solder balls 11 and column 6 are pressed into paste 12. The practice to this point differs from ball grid array attachment only in the presence of reinforcing solder column 6, contact 8, and pad 9. At the stage of fabrication immediately preceding reflow of solder 12, integrated circuit device 3 is situated at a nominal distance X from printed circuit board 1.

FIG. 2 schematically shows the structure following a reflow of the lower temperature solder, including an undesirable effect introduced by support column 6. Namely, dimension Y routinely exceeds dimension X, degrading the reflow solder connections between solder balls 11 and contacts 2. Connection failures, such as that depicted at reference numeral 13, follow either immediately or after nominal thermal or mechanical stress cycling.

One aspect of the dimension problem noted hereinbefore is attributable to component tolerance. Namely, ball grid arrays are typically made from 0.87 mm diameter balls with tolerances of ±0.02 to ±0.03 mm. Columns 6, which are fabricated by a different process, routinely have a tolerance of ±0.04 to 0.05 mm. Such a difference in the height is sufficient to degrade the joints when the integrated circuit device is attached to an organic printed circuit board.

Another effect is attributable to the fact that solder columns 6 have a substantially different cross section from balls 11. The integrated circuit device 3 is joined to board 1 utilizing solder paste 12 which is screened onto both contact pads 2 and 8 for columns 6 and balls 11. Since contact pads 2 and 8 are substantially different in size, they have different volumes of the eutectic solder pastes screened onto them. This results in differential wetting of the columns and balls during the solder reflow process, and an associated lifting of device 3. The lifting of device 3 degrades the joints between solder balls 11 and contact pads 2, as depicted in FIG. 2. Weak joints are undesirable in that they often fail or degrade the performance of the integrated circuit device during normal operation in the field. Thus, the use of support columns degrades rather than enhances the reliability of the solder ball connections.

FIG. 3 schematically depicts the ball grid array surface of integrated circuit device 3 according to the present invention, including some refinements thereof. Chevron like, L-shaped support elements, generally at 14, are added to the corner regions of the integrated circuit device ball grid array surface. The support elements are preferably composed of high melting temperature solder, typically the 90/10 lead/tin composition, and extend from each corner along the axes of the ball grid array over multiple solder ball spacing increments. For example, support solder 16 extends over 4 solder spacing increments while support solder 17 extends over three increments. Support solder 18 only extends one solder ball increment in each axial direction while remaining symmetrically within the range of the pattern defined by support solder 16.

Figure 4:
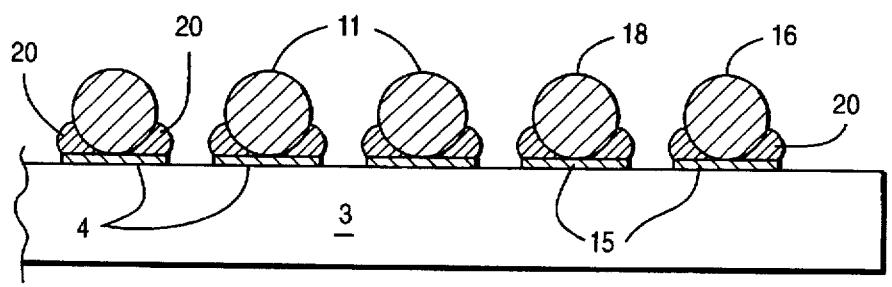
FIG. 4 is a schematic cross section at the location identified in FIG. 3, showing the relative correspondence of cross section along one axis of the array.

The support solder, including 16, 17 and 18, is characterized in that the cross section along one axis matches that of any solder ball 11. This matching cross section is illustrated in FIG. 4, where solder balls 11, support solder 16, and support solder 18 exhibit substantially the same cross sectional shape. The support solders, along with the solder balls, are typically made of a high melting point solder such as 90/10 lead/tin alloy. They are fabricated such that the support solder preform thickness is closely matched to the solder ball diameter. As also depicted in FIG. 4, support solders 16 and 18, along with solder balls 11, are attached to integrated device bonding pads 15 and 4, respectively, by utilizing low melting temperature solder 20. Such low melting temperature solder is typically an eutectic lead/tin, lead/bismuth, tin/bismuth, tin/indium, or the like alloy.

The difference in cross section at the corner locations of the support solder, such as at 19 of support solder 16, has minimal effect. Furthermore, where necessary any such effect can be offset through a narrowing of support solder structure such as depicted by dashed line 21.

A variety of other support solder shapes are shown generally at 22, the key feature being the aforementioned match of cross section in one axis to the cross section of the solder balls, while the other axis defines a continuum between solder ball locations. Clearly, as the number of intersecting branches increases, such as illustrated by the "+" pattern at 23, there will be an increased need for narrowing to compensate for molten solder surface tension effects. Note that the patterns may be symmetric or asymmetric, and as such allow the designer flexibility in placing the support solder at a location and in a relative pattern to maximize structural integrity.

Since solder is a thermal conductor, and board structures provide a level of heat sink capacity, the support solder may be selectively patterned and located to match high power output locations on the integrated circuit devices. Localized hot spots are common on processors and ASIC devices. Similarly, the support solder can be used to supply power, provide ground lines or convey signals to and from the integrated circuit device as necessary while providing the support function.

Figure 5:
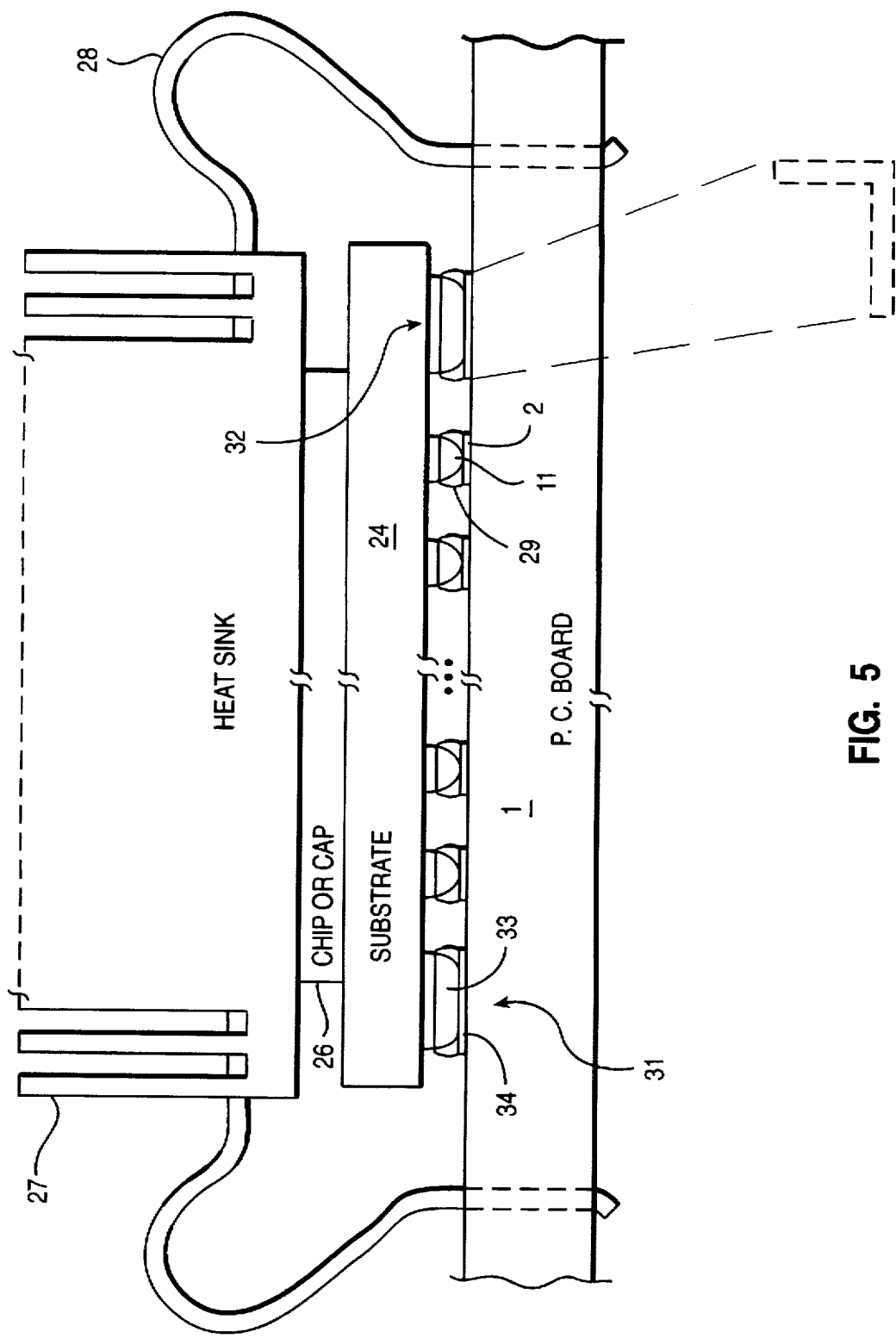
FIG. 5 is a schematic depicting a practice of the invention, showing the support solder structure, the heat sink, and sources of compressive force related to the composite structure as mounted on a printed circuit board.

FIG. 5 schematically illustrates a representative application of the invention in the context of mounting an integrated circuit device and associated heat sink to a printed circuit board. As shown, printed circuit board 1 has attached thereto by solder reflow an integrated circuit device composed of a ceramic substrate 24 and chip 26. Heat sink 27 is in physical contact with the top of the integrated circuit device to maximize thermal conduction between the integrated circuit and the heat sink. The embodiment depicted illustrates the use of a spring 28 which extends through printed circuit board 1 to maintain the compressive connection between the heat sink and the integrated circuit device. Heat sink 27 could also be bonded to the integrated circuit device.

The composite shown in FIG. 5 illustrates the presence of a ball grid array of high melting temperature solder balls 11 physically and electrically connected to printed circuit board contacts 2 through reflowed low temperature solder 29. Also depicted in the figure is support solder 33, preferably in the L-shape depiction at 14 in FIG. 3, in corners 31 and 32 of the integrated circuit device. The connections between the high melting temperature support solder 33 and underlying copper contacts 34 of printed circuit board 1 are also accomplished through the reflow of a low temperature solder.

Formation of the solder balls and support solder follows the general format utilized with attaching the solder balls alone. Namely, preformed solder balls and support solder are loaded into a boat capable of accommodating both shapes. The integrated circuit device and boat are then subjected to a low temperature reflow adequate to bond the high temperature solder balls and support solder to the integrated circuit device using deposited low temperature solder paste. Mounting onto the printed circuit board is accomplished by a separate process.

Mounting of the device begins with a screen deposit of solder paste through a mask onto the contacts of the printed circuit board, preferably using a paste with eutectic 37/63 lead/tin solder capable of reflow at a temperature between and 200° and 220° C. The integrated circuit device, with solder balls and support solder in place, is aligned so that the solder balls and support solder can be inserted into the solder paste on the printed circuit board. Finally, the composite is subjected to the reflow temperature of 200°–220° C.

The heat sink is, attached later, preferably using a thermal compound to maximize heat transfer between the integrated circuit device and the heat sink.

The resulting structure, as depicted in FIG. 5, provides not only the surface mount electrical connection benefits of a ball grid array but an integrated circuit device structure with reinforcing suitable to withstand the thermal and physical environments of heat sink cooled high power integrated circuit devices.

It will be understood by those skilled in the art that the embodiments set forth hereinbefore are merely exemplary of the numerous arrangements by which the invention may be practiced, and as such may be replaced by equivalents without departing from the invention which will now be defined by appended claims.

We claim:

1. A surface mount substrate suitable to connect an integrated circuit to a pattern of contacts on a surface of a dielectric planar, comprising:
   a matrix array of solder balls formed onto a first side of the substrate;
   at least one pattern of support solder formed onto the first side of the substrate and characterized in that:
   the support solder profile in a direction coincident with a first axis of the matrix array substantially matches a cross section of a formed solder ball; and
   the support solder profile in a direction coincident with a second axis of the matrix array provides a cross section showing a continuum of solder from one solder ball to a succeedingly located solder ball.

2. The apparatus recited in claim 1, wherein the substrate is a ceramic integrated circuit package.

3. The apparatus recited in claim 1, wherein the substrate is a flip-chip type integrated circuit die.

4. The apparatus recited in claim 1, wherein the substrate is an organic integrated circuit package.

5. The apparatus recited in claim 2, wherein support solder is in an "L" shaped pattern in two or more corners of the substrate.

6. The apparatus recited in claim 3, wherein support solder is in an "L" shaped pattern in two or more corners of the substrate.

7. The apparatus recited in claim 4, wherein support solder is in an "L" shaped pattern in two or more corners of the substrate.

8. The apparatus recited in claim 5, wherein the support solder is composed of high melting temperature solder.

9. The apparatus recited in claim 6, wherein the support solder is composed of high melting temperature solder.

10. The apparatus recited in claim 7, wherein the support solder is composed of high melting temperature solder.

11. The apparatus recited in claim 8, wherein the solder balls are substantially hemispherical in cross section.

12. The apparatus recited in claim 9, wherein the solder balls are substantially hemispherical in cross section.

13. The apparatus recited in claim 10, wherein the solder balls are substantially hemispherical in cross section.

14. A reinforced ball grid array device mounted to a printed circuit board and supporting a heat sink, comprising:
   a pattern of contacts on a printed circuit board;
   a substrate with an integrated circuit, the substrate comprising:
   a matrix array of solder balls formed onto a first side of the substrate; and
   at least one pattern of support solder formed onto the first side of the substrate characterized in that the support solder profile in a direction coinciding with a first axis of the matrix array substantially matches a cross section of a formed solder ball, and in that the support solder profile in a direction coincident with a second axis of the matrix array provides a cross section showing a continuum of solder extending from one solder ball to a succeedingly located solder ball;

solder bond connections between the pattern of contacts on the printed circuit board and corresponding solder balls and support solder on the substrate; and heat sink in thermal contact with a planar surface on a second side of the substrate.

15. The apparatus recited in claim 14, wherein the substrate is a ceramic integrated circuit package.

16. The apparatus recited in claim 14, wherein the substrate is a flip-chip type integrated circuit die.

17. The apparatus recited in claim 14, wherein the substrate is an organic integrated circuit package.

18. The apparatus recited in claim 15, wherein support solder is in an "L" shaped pattern in two or more corners of the substrate.

19. The apparatus recited in claim 16, wherein support solder is in an "L" shaped pattern in two or more corners of the substrate.

20. The apparatus recited in claim 17, wherein support solder is in an "L" shaped pattern in two or more corners of the substrate.

21. The apparatus recited in claim 18, wherein the support solder is composed of high melting temperature solder.

22. The apparatus recited in claim 19, wherein the support solder is composed of high melting temperature solder.

23. The apparatus recited in claim 20, wherein the support solder is composed of high melting temperature solder.

* * * * *